United States Patent [19]
Kwon et al.

[11] Patent Number: 5,973,972
[45] Date of Patent: Oct. 26, 1999

[54] PRECHARGE SYSTEM FOR A SEMICONDUCTOR MEMORY DEVICE

[75] Inventors: Kook-hwan Kwon; Hee-choul Park, both of Suwon, Rep. of Korea

[73] Assignee: Samsung Electronics, Co., Ltd., Suwon, Rep. of Korea

[21] Appl. No.: 08/743,021

[22] Filed: Nov. 4, 1996

[30] Foreign Application Priority Data

Nov. 3, 1995 [KR] Rep. of Korea ...................... 95-39616

[51] Int. Cl.[6] ...................................................... G11C 7/00
[52] U.S. Cl. .......................... 365/203; 365/190; 365/194; 365/207; 365/193; 365/204
[58] Field of Search .............................. 365/205, 189.01, 365/189.11, 203, 190

[56] References Cited

U.S. PATENT DOCUMENTS 5,506,805  4/1996  Hirose et al. ............................ 365/194
5,579,256  11/1996 Kajigaya et al. .......................... 365/51

*Primary Examiner*—Viet Q. Nguyen
*Attorney, Agent, or Firm*—Marger Johnson, & McCollom P.C.

[57] ABSTRACT

A method for precharging a bit line pair or data line pair in a semiconductor memory device includes generating a precharge pulse signal when a write enable line is deactivated at the beginning of a read cycle. The line pair is rapidly precharged by a pair of large transistors which turn on in response to the pulse signal. The pulse signal ends and turns of the transistors before a word line is enabled during the read cycle to prevent the large transistors from interfering with the bit sensing operation. A precharge circuit for precharging a bit line pair or data line pair in a semiconductor memory device includes a pulse generator having a delay circuit that determines the pulse width of a precharge pulse which is generated when a write enable line is deactivated. A write and precharge circuit includes two large transistors connected between a line pair and a power source that turn on and rapidly precharge the line pair during the precharge pulse. A third large transistor is connected between the lines of the line pair to equalize the voltages of the lines when the precharge pulse is generated.

3 Claims, 4 Drawing Sheets

PRECHARGE SYSTEM FOR A SEMICONDUCTOR MEMORY DEVICE

This application corresponds to Korean Patent Application No. 39616/95, filed Nov. 3, 1995, in the name of Samsung Electronics Company, Ltd. and incorporated herein by reference.

BACKGROUND OF THE INVENTION

1. Field of the Invention

This invention relates generally to semiconductor memory devices and more particularly to a precharge system for rapidly charging a bit line after switching from a write mode to a read mode.

2. Description of the Related Art

The access speed of a semiconductor memory device depends on the bit sensing operation when reading data from memory cells. When a semiconductor memory device is in a read mode, a pair of bit lines are typically precharged to a predetermined state at the beginning of a read cycle, so as to increase the speed of the bit sensing operation. However, in write mode, the individual bit lines of a bit line pair are driven to two different voltage levels, such that the bit lines must be precharged at the beginning of the next read mode. This decreases the data access speed. The data access speed further depends on the speed at which voltage differences are produced on data lines, i.e., the length of time required to change the voltage of the data lines from the precharged state to a readable logic level.

The bit line structure of a conventional semiconductor memory device is illustrated in FIG. 1. A memory cell 10 is connected between bit lines BL and /BL. A first precharge circuit 20 controllably connects the bit lines BL and /BL to a power supply voltage in response to a write control signal φWE. The first precharge circuit 20 includes two PMOS transistors M1 and M2, each having a controlled current path connected between the bit lines BL and /BL, respectively, and the power source voltage. The gates of M1 and M2 are connected to the write control signal φWE so as to precharge the bit lines BL and /BL in the read mode when the write control signal φWE is turned off (deactivated). Thus, the first precharge circuit is switched to selectively precharge the bit lines.

A second precharge circuit 30 is connected between the bit lines BL and /BL and the power source voltage so as to precharge the bit lines. The second precharge circuit 30 includes two PMOS transistors M3 and M4, each having a controlled current source connected between the bit lines BL and /BL, respectively, and the power source voltage. The gates of transistors M3 and M4 are connected to a power supply ground voltage. Thus, the second precharge circuit 30 always precharges the bit lines with the power source voltage.

A column gate circuit 40 is connected between bit lines BL and /BL and a pair of data lines SDL and /SDL to controllably connect the bit lines with the data lines in response to a column select signal "Y". The column gate circuit 40 includes a first transfer gate TG1 connected between bit line BL and data line SDL, and a second transfer gate TG2 connected between bit line /BL and data line /SDL. The column gate circuit 40 is switched by the column select signal "Y" to connect the bit lines with the data lines so as to form a signal path between memory cell 10 and an external input/output pad.

A write and precharge circuit 50 transfers external input data from lines DIN and /DIN to the data lines SDL and /SDL in response to the write control signal φWE. Circuit 50 includes two NAND gates NG1 and NG2 for driving the input data from lines DIN and /DIN onto the data lines SDL and /SDL, respectively, in response to the write control signal φWE. The NAND gates NG1 and NG2 apply the external input data to the data lines when the write control signal φWE is activated, i.e., driven to a high logic level. Circuit 50 also includes two PMOS transistors M5 and M6 connected between data lines SDL and /SDL, respectively, and the power source voltage. The gates of transistors M5 and M6 are connected to the write control signal φWE. Another PMOS transistor M7 has a controlled current path connected between the data line SDL and /SDL and a gate connected to the write control signal φWE. The PMOS transistors M5 and M6 precharge the data lines SDL and /SDL, respectively, with the power source voltage in the read mode when the write control signal φWE is activated (i.e., driven to a low logic level). Transistor M7 equalizes the voltages of the data lines in the read mode.

A sense amplifier 60 amplifies the data from data lines SDL and /SDL and outputs the data to the input/output pad.

In operation, the write control signal φWE of the conventional bit line circuit of FIG. 1 is activated, i.e., driven to a high logic level, during the write mode so that NAND gates NG1 and NG2 transfer input data from lines DIN and /DIN to the data lines SDL and /SDL, respectively. When the column select signal "Y" is enabled, i.e., driven to a high logic level, the column gate circuit 40 operates to connect data lines SDL and /SDL with bit lines BL and /BL, thereby transferring input data from lines DIN and /DIN into the memory cell 10.

When a read cycle is performed after a write cycle, the write control signal φWE is disabled (driven to a low logic level) so that the first and second precharge circuits 20 and 30 and the write and precharge circuit 50 operate to precharge and equalize the highly imbalanced bit lines BL and /BL. More specifically, in the read mode, when the write control signal is driven to a low logic level, PMOS transistors M1 and M2 in precharge circuit 20 are turned on, thereby precharging BL and /BL to the power source voltage level. PMOS transistors M3 and M4 of circuit 30, which are always turned on, also operate to precharge the bit lines. Additionally, PMOS transistors M5 and M6 of the write and precharge circuit 50 are also turned on by the write control signal φWE so as to precharge the data lines SDL and /SDL to the power source voltage level. Transistor M7 operates to equalize the voltages on the data lines in response to the write control signal.

Hence, the precharge circuits generally do not operate in the write mode, but instead are turned on to precharge and equalize the bit and data lines in the read mode. If the size of the transistors in the precharge circuits are increased, the bit lines will be precharged and equalized faster. However, large transistors would prevent a voltage difference from being produced on the bit lines during the read mode, thereby disabling the bit sensing operation. Therefore, in order to assure normal sensing operation of the bit lines, the sizes of transistors M1 to M7 must be kept small. Consequently, in such a conventional semiconductor memory device, the size of the precharge transistors is kept small resulting in a precharge time delay during a data access cycle and imperfect equalization.

Accordingly, a need remains for a method and apparatus for precharging lines in a semiconductor memory device which overcomes the above-mentioned problems.

SUMMARY OF THE INVENTION

It is therefore an object of the present invention to provide a method and apparatus for reducing the data access time of a semiconductor memory device.

A further object of the invention is to provide a method and apparatus for rapidly precharging and equalizing bit lines during a read cycle in a semiconductor memory device.

To achieve these and other objects, the applicants have invented a method and apparatus for precharging a bit line pair or data line pair in a semiconductor memory device by generating a precharge pulse signal when a write enable line is deactivated at the beginning of a read cycle. The line pair is rapidly precharged by a pair of large transistors which turn on in response to the pulse signal. The pulse signal ends and turns off the transistors before a word line is enabled during the read cycle to prevent the large transistors from interfering with the bit sensing operation.

One aspect of the present invention is a precharge system for a semiconductor memory device comprising a precharge circuit coupled to a line for precharging the line responsive to a pulse signal; and a pulse generating circuit coupled to the precharge circuit for generating the pulse signal responsive to a write signal. The pulse generating circuit includes a logic gate coupled to the precharge circuit for activating the pulse signal responsive to the write signal; and a delay circuit coupled to the logic gate for deactivating the pulse signal. The precharge circuit includes a transistor having a first terminal coupled to receive a power signal, a second terminal coupled to the data line, and a third terminal coupled to the pulse generating circuit to receive the pulse signal. The transistor has a relatively large size so as to rapidly charge the data line when the pulse signal is activated.

The memory device can also include a second data line, and the precharge circuit can include a second transistor having a first terminal coupled to receive a power signal, a second terminal coupled to the second data line, and a third terminal coupled to the pulse generating circuit to receive the pulse signal. The system can also include a third large transistor having a first terminal coupled to the data line, a second terminal coupled to the second data line, and a third terminal coupled to the pulse generating circuit to receive the pulse signal.

Another aspect of the present invention is a method for precharging a line in a semiconductor memory device, the method comprising rapidly charging the line only at the beginning of a read cycle. Charging the line includes generating a precharge pulse; and charging the line with a high capacity charging circuit responsive to the precharge pulse. The precharge pulse begins when a write signal is deactivated and lasts approximately until a word line is activated.

An advantage of the present invention is that it increases the precharge speed of a bit line or data line so as to reduce the data access time for a semiconductor memory device.

A further advantage of the present invention is that it does not interfere with the bit sensing operation during a read cycle.

Yet another advantage of the present invention is that the large size of the transistors provides better voltage equalization between the data lines.

The foregoing and other objects, features and advantages of the invention will become more readily apparent from the following detailed description of a preferred embodiment of the invention which proceeds with reference to the accompanying drawings.

DETAILED DESCRIPTION

An embodiment of a precharge system in accordance with the present invention is shown generally at 100. Prior to describing the detailed structure of the system 100, the key components of the system will be identified followed by a brief description of the operation of the system. Then a more detailed description of each of the components will be provided along with a more detailed description of the operation.

Figure 1:
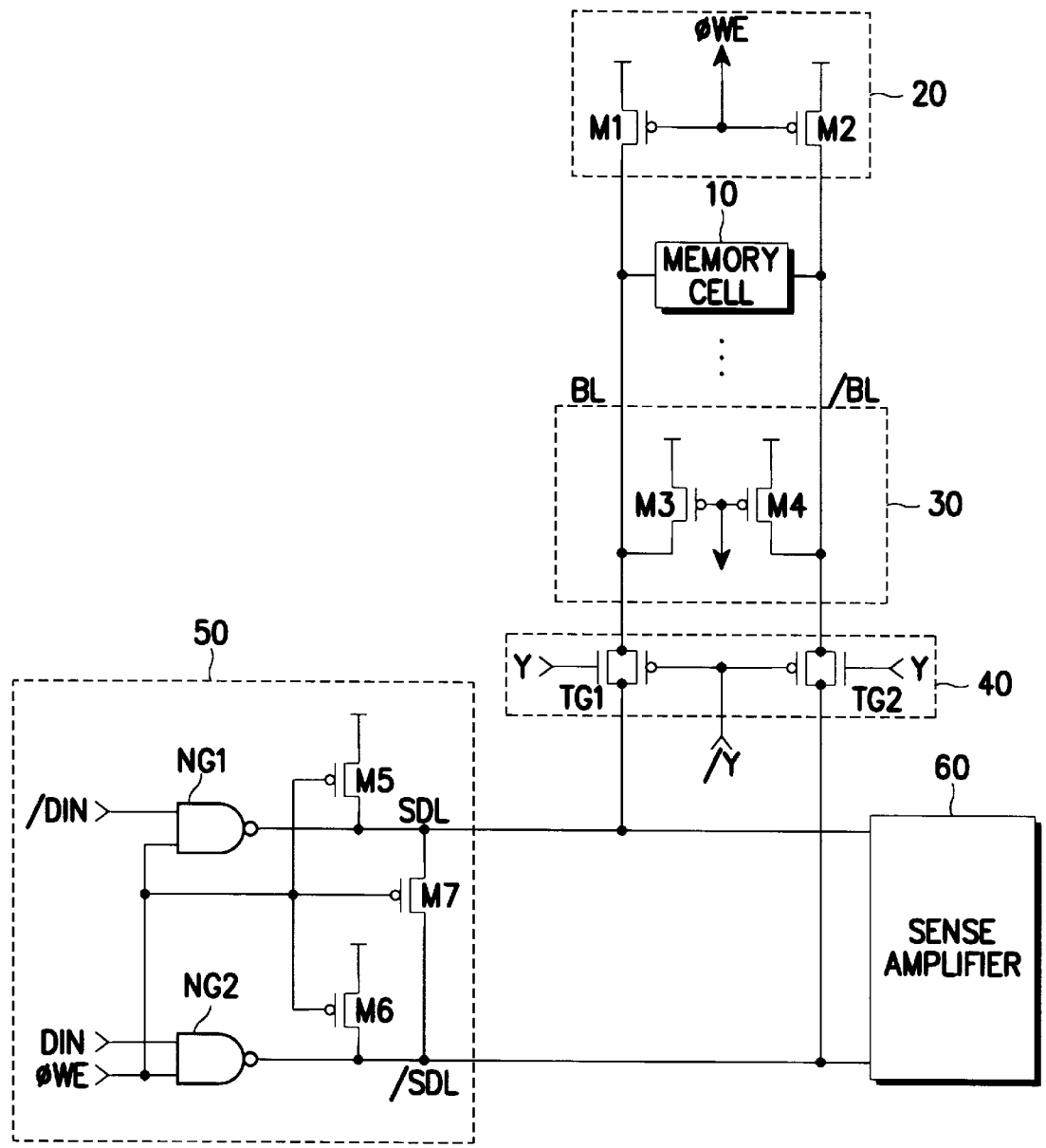
FIG. 1 is a schematic diagram of a prior art bit line and data line precharge circuit.
Figure 2:
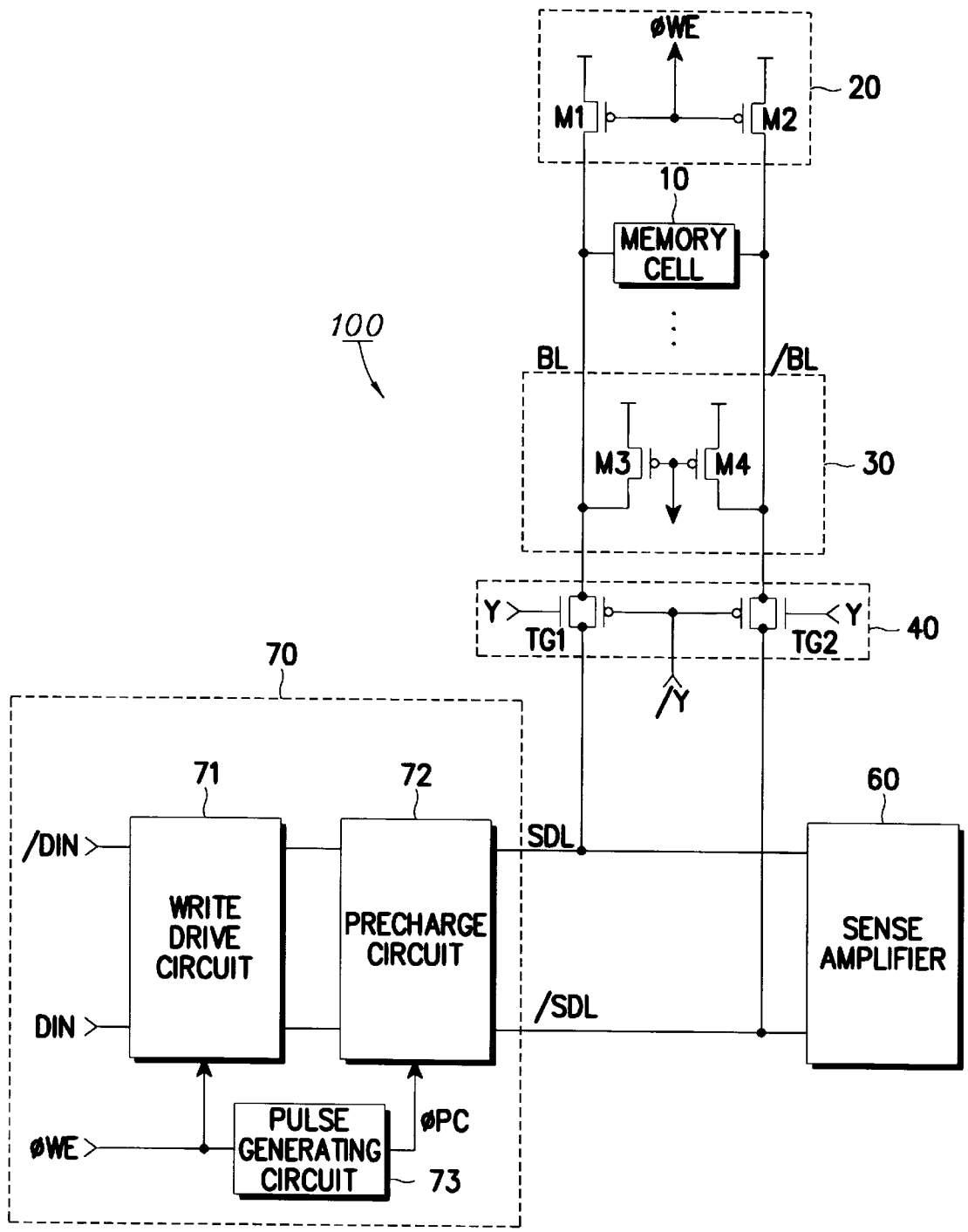
FIG. 2 is a schematic diagram of an embodiment of a precharge system in accordance with the present invention.

For convenience, components of the system of FIG. 2 that are the same as those in FIG. 1 will be represented with the same reference designators. Only the write and precharge circuit 70 of FIG. 2 is different from that of FIG. 1. The write control signal φWE is enabled to activate the write mode, while the column select signal "Y" is activated to select a memory cell in the write or read mode. When the column select signal "Y" is activated, the column gate circuit 40 operates to connect the bit lines with the data lines.

The write and precharge circuit 70 includes a write drive circuit 71 for transferring external input data from lines DIN and /DIN to the data lines SDL and /SDL when the write control signal φWE is activated. A pulse generating circuit 73 generates a precharge pulse on the control signal line φDPC in response to the write control signal φWE. A precharge circuit 72 precharges the data lines SDL and /SDL to the power source voltage in response to the precharge pulse. The precharge pulse begins when the control signal φPC is activated in response to the deactivation of the write control signal φWE when a write cycle ends and a read cycle begins. The precharge pulse ends when the control signal φPC is deactivated a fixed period of time T1 after it is activated. The precharge circuit 72 operates to rapidly precharge the data lines during the precharge pulse when the control signal φPC is activated.

Figure 3:
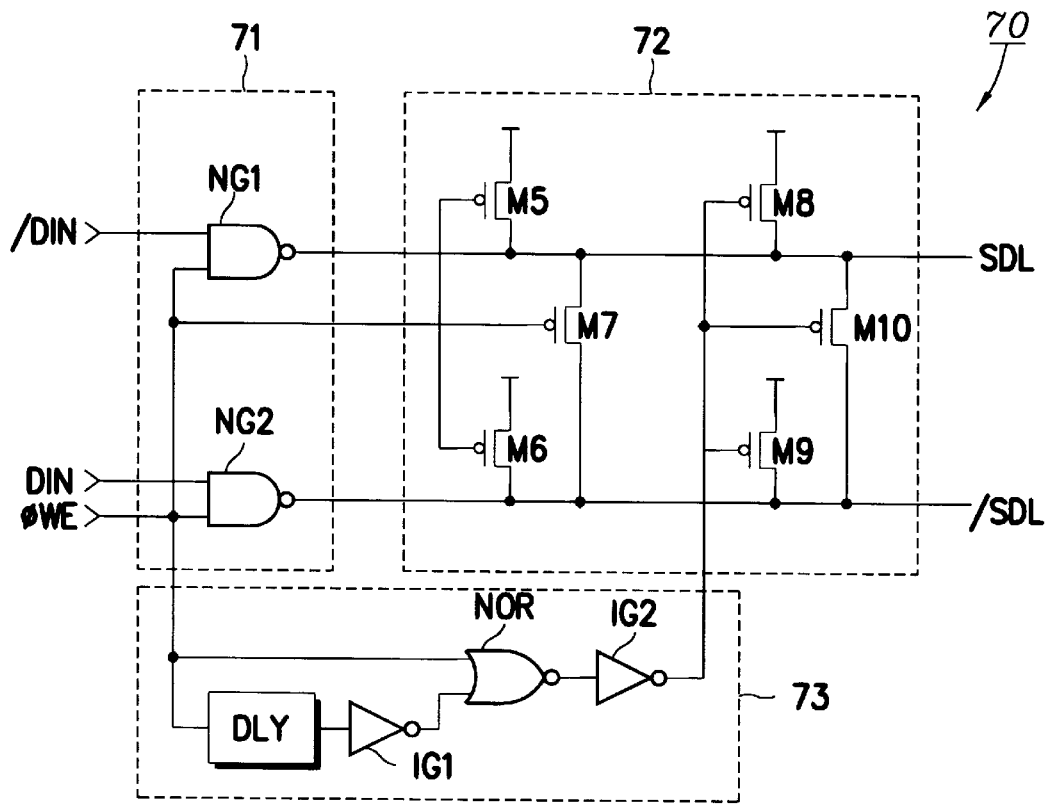
FIG. 3 is a schematic diagram showing more details of the write and precharge circuit of FIG. 2.

More detailed consideration will now be given to the structure of the precharge system 100 of the present invention. Referring to FIG. 3, the write drive circuit 71 includes a first NAND gate NG1 having a first input terminal connected to the data input line /DIN to receive input data, a second input terminal connected to the write enable line φWE to receive the write enable signal, and an output terminal connected to the data line SDL. A second NAND gate NG2 has a first input terminal connected to input data line DIN for receiving input data, a second input terminal connected to the write enable line φWE for receiving the write enable signal, and an output terminal connected to the data line /SDL. NAND gates NG1 and NG2 write the external input data from lines DIN and /DIN onto the data lines SDL and /SDL when the write control signal φWE is activated.

The pulse generating circuit 73 includes a delay circuit DLY having an input terminal connected to the write enable line φWE for receiving the write enable signal and output terminal connected to the input terminal of an inverter IG1. A NOR gate has a first input terminal connected to the write enable line φWE for receiving the write enable signal, a second input terminal connected to the output terminal of inverter IG1, and an output terminal connected to the input terminal of second inverter IG2. The pulse generating circuit 73 generates a pulse signal at the output terminal of inverter IG2 for a fixed period of time T1 determined by the delay circuit DLY in response to deactivation of the write enable signal φWE at the end of the write cycle and the start of a read cycle. The NOR gate operates to logically combine the write control signal φWE and the output of the delay circuit DLY.

The precharge circuit 72 includes two PMOS transistors M5 and M6 connected between the power source and the data lines SDL and /SDL, respectively. The gates of transistors M5 and M6 are connected to the write control line φWC. A PMOS transistor M7 has a controlled current path connected between the data lines and SDL and /SDL and a gate connected to the write control line φWE. PMOS transistors M5 and M6 precharge the data lines SDL and /SDL, respectively, in read mode when the write control signal φWE is deactivated, while PMOS transistor M7 equalizes the voltage between data lines SDL and /SDL in the read mode.

Precharge circuit 72 also includes two PMOS transistors M8 and M9, each having a controlled current path connected between the power source and the data lines SDL and /SDL, respectively. The gates of transistors M8 and M9 are connected to the output terminal of the pulse generator circuit 73 to receive the precharge pulse signal φPC. Another PMOS transistor M10 has a controlled current path connected between the data lines and a gate connected to the pulse generator 73 to receive the precharge pulse signal φPC. Transistors M8 and M9 precharge the data lines SDL and /SDL for a predetermined period of time T1 equal to the length of the precharge pulse at the start of the read mode, while transistor M10 equalizes the voltages of the data lines SDL and /SDL during the precharge pulse. Transistors M5 through M7 can be considered a first precharge circuit, while transistors M8 through M10 can be considered a second precharge circuit for the data lines.

PMOS transistors M8 through M10 are designed to have larger sizes than transistors M5 through M7, so that the second precharge circuit has a higher charge capacity than the first precharge circuit. The second precharge circuit only operates during the precharge pulse φPC at the beginning of a read cycle. The length of the precharge pulse is preferably set so that the precharge signal φPC is active from the time the write signal is deactivated until a word line W/L is activated during a read cycle.

Figure 4:
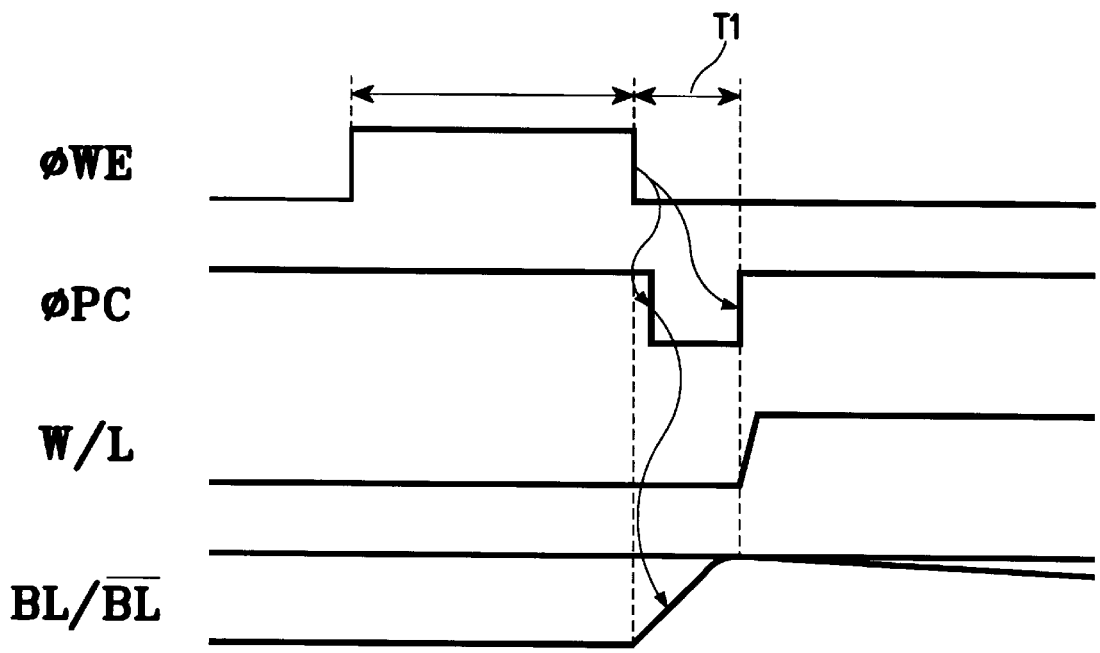
FIG. 4 is a timing diagram showing waveforms at various points in the circuits of FIGS. 2 and 3.

More detailed consideration will now be give to the operation of the precharge system 100. Referring to FIG. 4, it can be seen that the precharge pulse on the precharge signal φPC has a period from the end of the write control signal φWE until the start of the word line drive signal W/L. In the write mode, the write control signal φWE is active (driven to a high logic level), thereby turning off transistors M1–M2, M5–M7, and M8–M10 so as not to precharge the bit and data lines. During the write mode, there is a large voltage difference between the logic levels of the input data on lines DIN and /DIN.

When changing from write mode to read mode, the write control signal φWE is deactivated by driving it to a low logic level as shown in FIG. 4. This causes transistors M1–M2 and M5–M7 to turn on and precharge the bit lines BL and /BL and data lines SDL and /SDL. The deactivation of the write control signal φWE causes the NOR gate and inverter IG2 to activate the precharge signal φPC (driving it to a low logic level), thereby beginning the precharge pulse. When the precharge signal φPC is driven to the active low logic level, transistors M8 through M10 are turned on to recharge data lines SDL and /SDL.

At the beginning of a read cycle, after the end of a write cycle, transistors M1 and M2 of precharge circuit 20, along with transistors M5 through M7 of precharge circuit 70, are turned on by the write control signal φWE so as to precharge and equalize the data lines SDL and /SDL and the bit lines BL and /BL. Additionally, transistors M3 and M4 of precharge circuit 30 are always maintained in an on state to precharge the bit lines BL and /BL. The precharge signal on the data lines SDL and /SDL is transferred through the column gate circuit 40 to precharge the bit lines BL and /BL.

Since the sizes of the transistors M8 through M10 are larger then those of the other precharge circuits, the data lines SDL and /SDL are precharged and equalized rapidly during the precharge pulse when the precharge signal φPC is at the active low logic level as shown in FIG. 4. Since transistors M8 through M10 are turned off at the end of the precharge pulse just before the word line signal W/L is activated, the transistors M8 through M10 do not interfere with the sensing operation of the bit lines during the read mode.

Figure 5A:
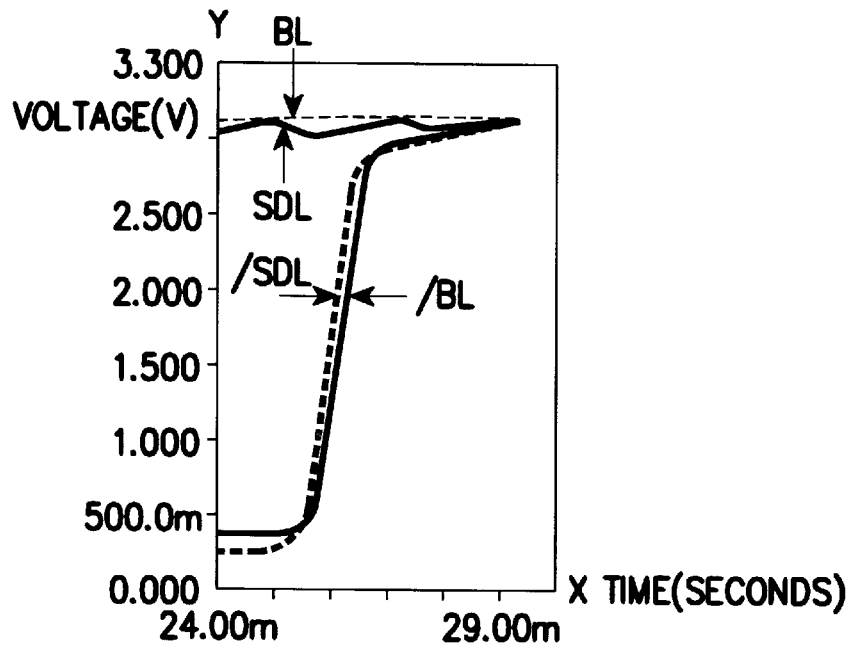
FIG. 5A is a drawing of waveforms illustrating the precharge operation of a prior art bit line precharge circuit.
Figure 5B:
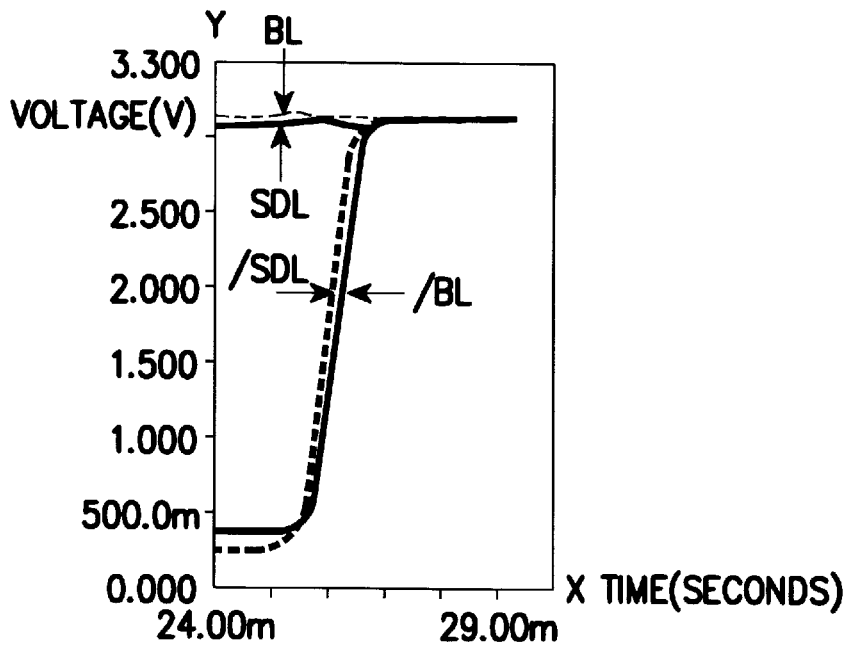
FIG. 5B is a drawing of waveforms illustrating the operation of a bit line and data line precharge system in accordance with the present invention.

The improved operation of a precharge system in accordance with the present invention is illustrated with reference to FIGS. 5A and 5B. As shown in FIG. 5A, a conventional precharge circuit requires a considerably longer precharge time due to the inability of the small size transistors to drive the large capacitances of the bit lines. This increases the data access time. However, referring to FIG. 5B the large precharge transistors M8–M10 of the present invention rapidly precharge and equalize the data and bit lines at the start of the read mode during the precharge pulse resulting in reduced data access time and higher speed operation.

Having described and illustrated the principles of the invention in a preferred embodiment thereof, it should be apparent that the invention can be modified in arrangement and detail without departing from such principles. We claim all modifications and variations coming within the spirit and scope of the following claims.

We claim:

1. A precharge system for a semiconductor memory device, the system comprising:

a precharge circuit coupled to a line for precharging the line responsive to a pulse signal; and a pulse generating circuit coupled to the precharge circuit for generating the pulse signal responsive to a write signal;

wherein the pulse generating circuit includes:

a logic gate coupled to the precharge circuit for generating the pulse signal responsive to the activation of the write signal; and a delay circuit coupled to the logic gate for deactivating the pulse signal; and wherein:

the delay circuit includes an input terminal coupled to receive the write signal and an output terminal;

the logic gate is a NOR gate having a first input terminal coupled to receive the write signal, a second input terminal, and an output terminal; and the pulse generating circuit further includes:

a first inverter having an input terminal coupled to the output terminal of the delay circuit and an output terminal coupled to the second input terminal of the NOR gate; and a second inverter having an input terminal coupled to the output terminal of the NOR gate and an output terminal coupled to the precharge circuit.

2. A precharge system for a semiconductor memory device, the system comprising:

a pulse generating circuit for generating a pulse signal responsive to a write signal, wherein the pulse generating circuit activates the pulse signal when the write signal is deactivated and deactivates the pulse signal a predetermined amount of time thereafter;

a first MOS precharge transistor coupled between a first line and a power supply terminal for precharging the first line when the write signal is deactivated;

a second MOS precharge transistor coupled between a second line and the power supply terminal for precharging the second line when the write signal is deactivated;

a third MOS precharge transistor coupled between the first line and the power supply terminal for precharging the first line when the pulse signal is activated; and a fourth MOS precharge transistor coupled between the second line and the power supply terminal for precharging the second line when the pulse signal is activated;

wherein the third and fourth MOS transistors are relatively larger than the first and second MOS transistors so as to precharge the first and second lines faster than the first and second MOS transistors; and whereby the first, second, third, and fourth MOS transistors all precharge simultaneously while the pulse signal is activated.

3. A method for precharging a first bitline and a second bitline forming a bitline pair in a semiconductor memory device, the method comprising:

precharging the first bitline with a first MOS precharge transistor whenever a write signal is deactivated;

precharging the second bitline with a second MOS precharge transistor whenever the write signal is deactivated;

precharging the first bitline with a third MOS precharge transistor for a predetermined time after the write signal is deactivated; and precharging the second bitline with a fourth MOS precharge transistor for a predetermined time after the write signal is deactivated;

wherein the third and fourth MOS transistors are relatively larger than the first and second MOS transistors so as to precharge the first and second lines faster than the first and second MOS transistors; and whereby the third and fourth MOS transistors automatically turned off after the predetermined time.

* * * * *

UNITED STATES PATENT AND TRADEMARK OFFICE
CERTIFICATE OF CORRECTION

PATENT NO. : 5,973,972
DATED : October 26, 1999
INVENTOR(S) : Kwon et al.

It is certified that error appears in the above-identified patent and that said Letters Patent is hereby corrected as shown below:

Title page,
ABSTRACT, line 7, "of" should read -- off --

Column 4,
Line 38, "ØDPC" should read -- ØPC --

Signed and Sealed this

Twenty-sixth Day of March, 2002

*Attest:*

*Attesting Officer*

JAMES E. ROGAN
*Director of the United States Patent and Trademark Office*